United States Patent
Kiyota

(10) Patent No.: US 11,909,173 B2
(45) Date of Patent: Feb. 20, 2024

(54) WAVELENGTH-TUNABLE LASER AND OPTICAL MODULE

(71) Applicant: FURUKAWA ELECTRIC CO., LTD., Tokyo (JP)

(72) Inventor: Kazuaki Kiyota, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 854 days.

(21) Appl. No.: 16/984,345

(22) Filed: Aug. 4, 2020

(65) Prior Publication Data
US 2020/0366059 A1 Nov. 19, 2020

Related U.S. Application Data

(63) Continuation of application No. PCT/JP2019/004674, filed on Feb. 8, 2019.

(30) Foreign Application Priority Data

Feb. 8, 2018 (JP) ................................. 2018-021087

(51) Int. Cl.
*H01S 5/06* (2006.01)
*H01S 5/026* (2006.01)
(Continued)

(52) U.S. Cl.
CPC ............ *H01S 5/0612* (2013.01); *H01S 5/026* (2013.01); *H01S 5/101* (2013.01); *H01S 5/125* (2013.01); *H01S 5/1209* (2013.01)

(58) Field of Classification Search
CPC ........ H01S 5/0612; H01S 5/026; H01S 5/101; H01S 5/1209; H01S 5/125;
(Continued)

(56) References Cited

U.S. PATENT DOCUMENTS 7,480,425 B2 * 1/2009 Gunn .................. G02B 6/4246
385/37
8,368,995 B2 * 2/2013 Dallesasse .............. H01S 5/021
359/279
(Continued)

FOREIGN PATENT DOCUMENTS

CN 1862898 A 11/2006
CN 1862899 A 11/2006
(Continued)

OTHER PUBLICATIONS

Combined Chinese Office Action and Search Report dated Dec. 16, 2022, in corresponding Chinese Patent Application No. 201980011889.4 (with English Translation and English Translation of Category of Cited Documents), 16 pages.
(Continued)

*Primary Examiner* — Vu A Vu
(74) *Attorney, Agent, or Firm* — Oblon, McClelland, Maier & Neustadt, L.L.P.

(57) ABSTRACT

A waveguide based wavelength-tunable laser formed on a semiconductor substrate includes a first reflector from which laser light is output, a second reflector configuring a laser resonator together with the first reflector, a gain portion that is provided between the first reflector and the second reflector, at least two wavelength filters that can adjust wavelength characteristics and adjust a wavelength of the laser light, and a phase adjuster that adjusts an optical path length in the laser resonator, and a waveguide is formed to fold back an optical path by an angle of substantially 180 degrees between the first reflector and the second reflector.

17 Claims, 6 Drawing Sheets

(51) Int. Cl.
*H01S 5/10* (2021.01)
*H01S 5/12* (2021.01)
*H01S 5/125* (2006.01)

(58) Field of Classification Search
CPC ............ H01S 5/02251; H01S 5/06256; H01S 5/0261; H01S 5/06246; H01S 5/0687; H01S 5/1007; H01S 5/1212; H01S 5/142; H01S 5/2213; H01S 2301/02; H01S 2301/176
USPC .......................................................... 372/20
See application file for complete search history.

(56) References Cited

U.S. PATENT DOCUMENTS

| | | | |
|---|---|---|---|
| 8,467,122 B2* | 6/2013 | Zheng | ............... H01S 5/142 359/344 |
| 9,020,004 B2* | 4/2015 | Jeong | ............... H01S 5/1032 372/99 |
| 9,209,601 B2 | 12/2015 | Davies et al. | |
| 9,240,673 B2* | 1/2016 | Rickman | ............... H01S 5/021 |
| 9,312,662 B1 | 4/2016 | Larson | |
| 9,509,119 B2* | 11/2016 | Chen | ............... H01S 5/0612 |
| 9,559,487 B2* | 1/2017 | Doerr | ............... H01S 5/3235 |
| 9,774,164 B2* | 9/2017 | Chaouch | ............... H01S 5/3013 |
| 9,935,426 B2 | 4/2018 | Kaneko | |
| 10,193,305 B2 | 1/2019 | Kawakita et al. | |
| 2004/0179569 A1 | 9/2004 | Sato et al. | |
| 2006/0222038 A1 | 10/2006 | Yamazaki | |
| 2008/0232409 A1 | 9/2008 | Yamazaki | |
| 2012/0189025 A1* | 7/2012 | Zheng | ............... H01S 5/1071 372/20 |
| 2014/0126601 A1 | 5/2014 | Jeong | |
| 2015/0010264 A1 | 1/2015 | Kaneko | |
| 2017/0098921 A1* | 4/2017 | Takabayashi | ....... H01S 5/02251 |
| 2017/0353008 A1 | 12/2017 | Sugiyama | |
| 2018/0026426 A1 | 1/2018 | Kawakita et al. | |

FOREIGN PATENT DOCUMENTS

| | | |
|---|---|---|
| CN | 1938917 A | 3/2007 |
| CN | 103718398 A | 4/2014 |
| CN | 107431331 A | 12/2017 |
| CN | 107482475 A | 12/2017 |
| JP | 2004-273993 A | 9/2004 |
| JP | 2005-327881 A1 | 11/2005 |
| JP | 2008-066318 A | 3/2008 |
| JP | 2008-294371 A1 | 12/2008 |
| JP | 2011-109048 A | 6/2011 |
| JP | 2015-012093 A | 1/2015 |
| JP | 2016-178283 A | 10/2016 |
| JP | 2017-142348 A | 8/2017 |

OTHER PUBLICATIONS

Office Action dated Dec. 20, 2022, in corresponding Japanese Patent Application No. 2019-571172 (with English Translation), 8 pages.
International Search Report dated May 14, 2019 in PCT/JP2019/004674 filed on Feb. 8, 2019, 2 pages.
Chinese Office Action dated Jul. 13, 2023 in Chinese Application 201980011889.4, (with unedited computer-generated English translation), 14 pages.

* cited by examiner

WAVELENGTH-TUNABLE LASER AND OPTICAL MODULE

CROSS-REFERENCE TO RELATED APPLICATION(S)

This application is a continuation of International Application No. PCT/JP2019/004674, filed on Feb. 8, 2019 which claims the benefit of priority of the prior Japanese Patent Application No. 2018-021087, filed on Feb. 8, 2018, the entire contents of which are incorporated herein by reference.

BACKGROUND

The present disclosure relates to a wavelength-tunable laser and an optical module.

In the related art, wavelength-tunable lasers configured by combining a plurality of filters having wavelength selectivity have been known. For example, when two reflection mirrors (reflection-type filters) each having periodical reflectivity (reflection comb) for a wavelength are arranged with a gain portion interposed therebetween, a laser resonator is configured at a wavelength (for example, a reflection peak wavelength) at which both reflection mirrors have high reflectivity and laser emission occurs. In this case, a wavelength at which reflection peaks of the two reflection mirrors coincide with each other varies by adjusting wavelength characteristics of the two reflection mirrors, so that an emission wavelength can be widely tuned. The above-mentioned design of the wavelength-tunable laser has been known as a system utilizing a Vernier effect. In addition to the Vernier effect, a wavelength-tunable laser system in which reflection mirrors each having adjustable wavelength selectivity are combined has been known.

As the filters having the wavelength selectivity, there is a transmission-type filter such as a ring resonator in addition to the reflection-type filter having periodical reflectivity, such as an SG-DBR. The ring resonator has periodical transmissivity, so that the Vernier effect can be utilized by combining two ring resonators. When the transmission-type filters are used, it is necessary to separately prepare reflection mirrors having wide reflection bandwidths and combining them with the transmission-type filters. In this respect, the reflection-type filter can be regarded as a component in which a filter function and a mirror function are integrated into one.

The wavelength-tunable laser utilizing the filters is generally formed by two reflection mirrors configuring the laser resonator, a plurality of (equal to or more than two) filters having adjustable wavelength selectivity, a phase adjuster for selecting a cavity (resonator) mode in which laser is emitted in the laser resonator, and a gain portion arranged between the two mirrors and configured to perform optical amplification for laser emission. As described above, the reflection mirrors and the filters can be integrally configured. Similarly, the reflection mirrors and the phase adjuster can be integrally configured.

In such a wavelength-tunable laser, a semiconductor optical amplifier (SOA) is integrated in a laser chip in order to provide high optical power in many cases. When the SOA is integrated, the SOA is arranged on the opposite side to the gain portion with respect to one of the reflection mirrors configuring the wavelength-tunable laser (it is assumed to be the reflection mirror on the output side of laser light). An arrangement position of the SOA corresponds to the outside of the laser resonator of the wavelength-tunable laser. An integrated matter of the wavelength-tunable laser and the SOA is also called a wavelength-tunable laser. In general, the wavelength-tunable laser accommodated in a package is used as a wavelength-tunable laser module.

References are made to U.S. Pat. Nos. 9,312,662 and 9,209,601.

SUMMARY

There is a need for providing a wavelength-tunable laser and an optical module which are appropriate for miniaturization.

According to an embodiment, a waveguide based wavelength-tunable laser formed on a semiconductor substrate, includes: a first reflector from which laser light is output; a second reflector configuring a laser resonator together with the first reflector; a gain portion that is provided between the first reflector and the second reflector; at least two wavelength filters that can adjust wavelength characteristics and adjust a wavelength of the laser light; and a phase adjuster that adjusts an optical path length in the laser resonator. Further, a folded portion configured by a waveguide that folds back an optical path by an angle of substantially 180 degrees is provided between the first reflector and the second reflector.

According to an embodiment, A waveguide based wavelength-tunable laser formed on a semiconductor substrate, includes: a first reflector from which laser light is output; a second reflector configuring a laser resonator together with the first reflector; a gain portion that is provided between the first reflector and the second reflector; at least two wavelength filters that can adjust wavelength characteristics and adjust a wavelength of the laser light; a phase adjuster that adjusts an optical path length in the laser resonator; and a semiconductor optical amplifier that is provided on a laser light output side of the first reflector. Further, a folded portion configured by a waveguide that folds back an optical path by an angle of substantially 180 degrees is provided between the first reflector and the semiconductor optical amplifier.

DETAILED DESCRIPTION

Figure 1:
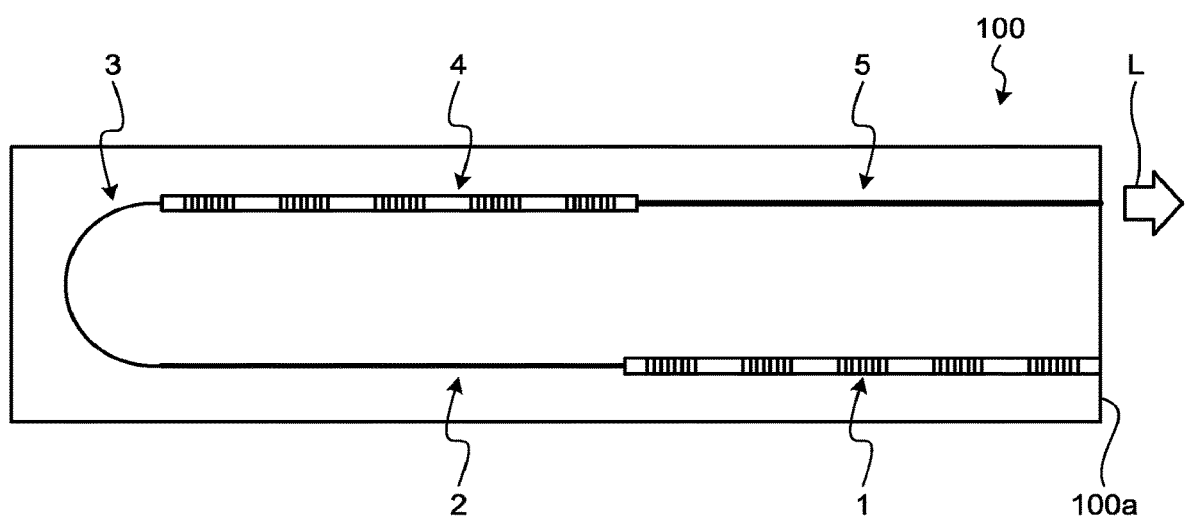
FIG. 1 is a schematic view of a wavelength-tunable laser device according to a first embodiment.

In recent years, optical transceivers have been required to be miniaturized more than ever before. As a reason for this, the densities of systems can be increased by miniaturization. In the related art, laser modules have been miniaturized by devising the configurations of the modules. That is to say, the laser modules have been miniaturized by miniaturizing components such as a bulk optical system for introducing output from a laser chip to an optical fiber and a wavelength locker for branching and monitoring an output beam. As the modules are increasingly miniaturized, an area occupied by these components is reduced and further improvement becomes difficult. On the contrary, an area occupied by the laser chip in the module is relatively large, resulting in the new problem that the laser chip needs to be reduced in size for further miniaturization.

In particular, as for the wavelength-tunable laser configured by combining the filters, the laser chip tends to be long because it includes the large number of components including the wavelength-tunable laser. Particularly, when the SOA is integrated in the wavelength-tunable laser, the laser chip tends to be longer because the SOA is also the component of the wavelength-tunable laser.

Hereinafter, embodiments will be described with reference to the drawings. The embodiments do not limit the present disclosure. In the drawings, the same reference numerals appropriately denote the same or corresponding components, and overlapped explanation thereof is appropriately omitted. It should be noted that the drawings are schematic and relations of dimension among the components, ratios of the components, and the like can be different from actual ones. Among the drawings, the relations of the dimension and the ratios can be different in some parts. Each of the following wavelength-tunable laser devices according to first to eighth embodiments is a laser chip of a waveguide-type (waveguide based) wavelength-tunable laser formed on a semiconductor substrate.

First Embodiment

FIG. 1 is a schematic view of a wavelength-tunable laser device according to a first embodiment. A wavelength-tunable laser device 100 is configured by connecting a known sampled grating distributed Bragg reflector (SG-DBR) 1 serving as a wavelength filter, a gain portion 2, a bending waveguide 3, an SG-DBR 4, and an SOA in this order.

The SG-DBR 1 includes a second reflector and a wavelength filter that are integrally configured. The SG-DBR 4 includes a first reflector from which laser light is output and a wavelength filter that are integrally configured. The SG-DBR 1 and the SG-DBR 4 configure a laser resonator. The SG-DBR 1 and the SG-DBR 4 have, as wavelength characteristics, periodical reflection peaks with different wavelength intervals. Each of the SG-DBR 1 and the SG-DBR 4 has a heater (not illustrated) on the upper surface thereof, and the wavelength characteristics thereof can be adjusted.

The gain portion 2 is provided between the SG-DBR 1 and the SG-DBR 4 and exerts an optical amplification function by receiving supply of a driving current.

The bending waveguide 3 is provided between the SG-DBR 1 and the SG-DBR 4 and is bent in a U shape. The bending waveguide 3 has a heater (not illustrated) on the upper surface thereof and functions as a phase adjuster that adjusts an optical path length in the laser resonator and selects a cavity mode in which laser is emitted.

The SOA 5 is provided on the laser light output side of the SG-DBR 4 on a semiconductor substrate. When the SOA 5 receives supply of a driving current, it amplifies the laser light output from the SG-DBR 4 and outputs it as high-power laser light L from an end facet 100*a* of the wavelength-tunable laser device 100. The wavelength of the laser light L is, for example, in a wavelength band range of 1.55 μm.

It is preferable that anti-reflection (AR) coating be applied to the end facet 100*a* in order to prevent facet reflection. In the wavelength-tunable laser device 100, it is sufficient that the AR coating is applied to only one end facet 100*a*, and the number of times of the coating process to be performed is therefore reduced. In order to further prevent the facet reflection, a waveguide of the SOA 5 is preferably inclined by several degrees (typically, seven degrees) with respect to the normal line of the end facet 100*a* in the vicinity of the end facet 100*a*.

In the wavelength-tunable laser device 100, the wavelength of the laser light L can be adjusted by adjusting the wavelength characteristics of the SG-DBR 1 and the SG-DBR 4 with the heaters. The wavelength-tunable laser device 100 therefore functions as a Vernier-type wavelength-tunable laser.

In the wavelength-tunable laser device 100, the bending waveguide 3 has a folded portion configured by a waveguide that folds back an optical path by an angle of substantially 180 degrees between the SG-DBR 1 and the SG-DBR 4, thereby reducing the length of the laser chip and achieving miniaturization thereof. That is to say, the bending waveguide 3 includes the folded portion between the SG-DBR 1, and the SG-DBR 4 that are integrally configured and the phase adjuster.

When the bending waveguide 3 is not provided, the SG-DBR 1, the gain portion 2, a linear waveguide, the SG-DBR 4, and the SOA 5 are arranged in this order linearly. With this arrangement, the length of the laser chip is increased, and an example of a typical value thereof is 3 mm. In contrast, arrangement with the folded portion by the bending waveguide 3 as in the wavelength-tunable laser device 100, the length of the laser chip can be approximately halved. The length of the wavelength-tunable laser device 100 is, for example, 1.8 mm and can be made shorter by equal to or more than 1 mm than the case in which the components are arranged linearly.

Although the difference of 1 mm is not significant in wavelength-tunable laser modules in the related art, the difference of 1 mm cannot be ignored at all in recent microminiaturized wavelength-tunable laser modules, and an effect of miniaturization by reducing the length is extremely large. In contrast, the width of the wavelength-tunable laser chip is larger than that in the case of the arrangement with no folded portion in some cases. An example of a typical width is 0.35 mm in the case of the arrangement with no folded portion whereas the width is, for example, 0.5 mm in the case of the arrangement with the folded portion by the bending waveguide 3 as in the wavelength-tunable laser device 100. This width is however sufficiently smaller than other components configuring a wavelength-tunable laser module such as an optical isolator, and can be ignored.

As described above, the wavelength-tunable laser device 100 can be miniaturized.

Figure 2A:
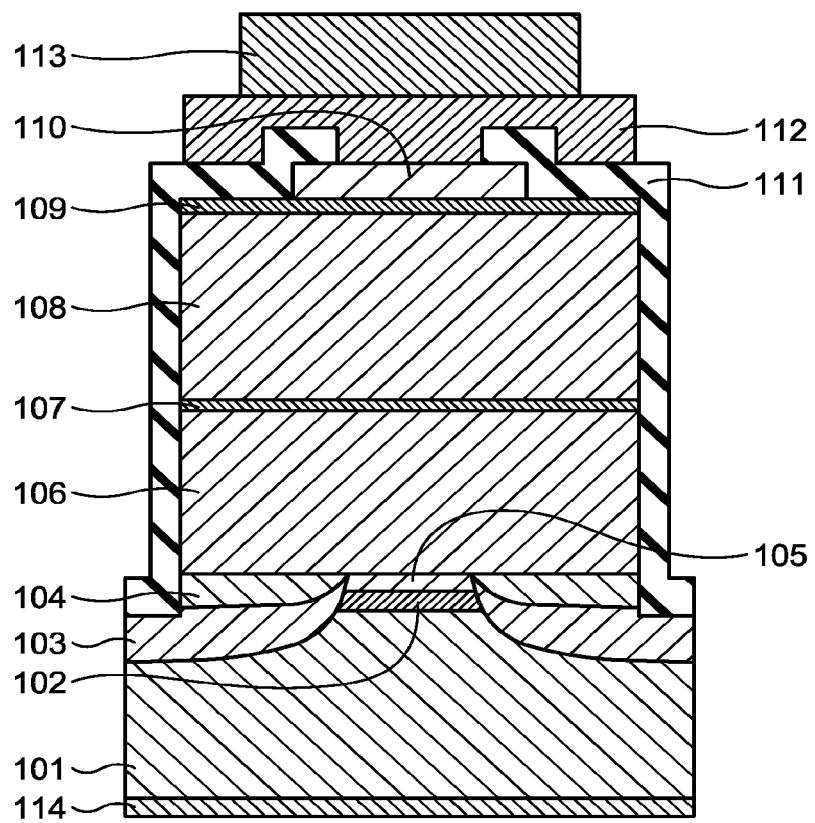
FIG. 2A is a schematic cross-sectional view of components of the wavelength-tunable laser device illustrated in FIG. 1.

An example of the cross-sectional structure of the components of the wavelength-tunable laser device 100 will be described with reference to FIGS. 2A and 2B. FIG. 2A is a cross-sectional view when the gain portion 2 is cut along a plane perpendicular to the waveguide. In the gain portion 2, an active core layer 102 serving as a waveguide made of GaInAsP and having a multiple quantum well structure and a spacer layer 105 made of p-InP are formed on a substrate 101 made of n-InP and also serving as a lower cladding layer. The composition of the active core layer 102 is adjusted so as to emit light at a laser emission wavelength of the wavelength-tunable laser device 100. The substrate 101, the active core layer 102, and the spacer layer 105 have a mesa structure, and both sides thereof are embedded with a lower current block layer 103 made of p-InP and an upper current block layer 104 made of n-InP. That is to say, the gain portion 2 has a buried hetero (BH) structure and can provide high current efficiency. An upper cladding layer 106 made of p-InP, an etch stop layer 107 made of p-GaInAsP, an upper cladding layer 108 made of p-InP, and a contact layer 109 made of p-GaInAs are formed in order thereon. A p-side electrode 110 is formed on the contact layer 109.

Trenches having depths to the upper current block layer 104 from the contact layer 109 are formed at separated positions on both sides of the active core layer 102 to prevent a current from flowing around into regions other than a desired region. A passivation film 111 made of an insulating material such as SiNx is further formed. A part of the passivation film 111 is opened, and electrodes 112 and 113 for supplying the current to the $_A$-side electrode 110 are formed in order in the opening so as to be electrically connected to the p-side electrode 110. An n-side electrode 114 is formed on the back surface of the substrate 101.

Figure 2B:
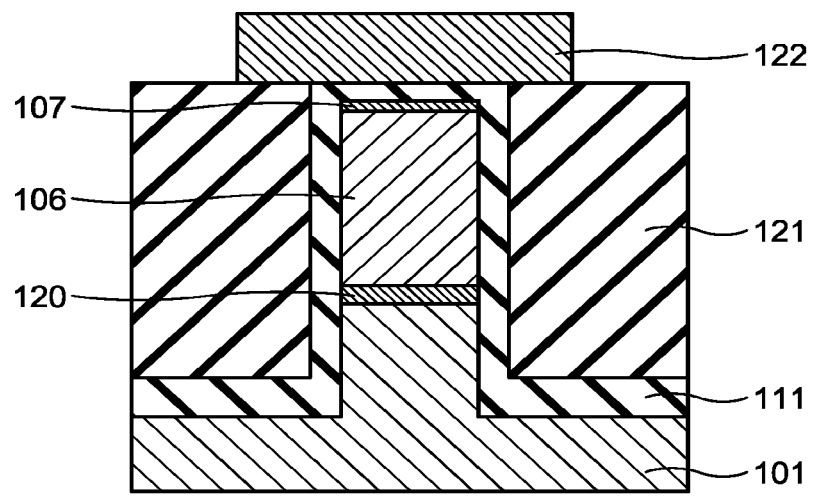
FIG. 2B is a schematic cross-sectional view of the components of the wavelength-tunable laser device illustrated in FIG. 1.

FIG. 2B is a cross-sectional view of the bending waveguide 3. In the bending waveguide 3, a waveguide core layer 120 made of GaInAsP, the upper cladding layer 106, and the etch stop layer 107 are formed in order on the substrate 101. The composition of the waveguide core layer 120 is adjusted so as not to absorb light at the laser emission wavelength of the wavelength-tunable laser device 100.

An upper portion of the substrate 101 to the etch stop layer 107 has a high-mesa structure, and the high-mesa structure is covered with the passivation film 111. Both sides of the high-mesa structure are embedded with a resin material 121 such as polyimide for flattening the upper surface thereof, and so on. A heater 122 is formed above the high-mesa structure. The bending waveguide 3 also functions as the phase adjuster and therefore employs the high-mesa structure that is easy to increase thermal impedance in order to improve efficiency of temperature variation with the heater. The high-mesa structure does not easily generate bending loss even with a relatively small diameter and is therefore suitable as the structure of the bending waveguide.

The SOA 5 has a cross-sectional structure similar to that of the gain portion 2. The SG-DBRs 1 and 4 have cross-sectional structures similar to that of the bending waveguide 3. Note that in each of the SG-DBRs 1 and 4, the waveguide core layer is arranged discontinuously in an optical waveguide direction so as to form diffraction grating.

Since the gain portion 2 and the bending waveguide 3 have different waveguide structures, connection loss may be reduced by, for example, providing a waveguide conversion region in a connection portion thereof.

In the wavelength-tunable laser device 100, the gain portion 2 and the SOA 5 are arranged on both sides with the folded portion interposed therebetween. A semiconductor optical device is made of a single crystal material. The semiconductor optical device is therefore required to be designed based on the orientation of the crystal. In particular, in a structure requiring regrowth of the crystal like the BH structure, design needs to be performed such that the orientation of the waveguide is within a range of a specific crystal orientation. Accordingly, the waveguides of the SOA 5 and the gain portion 2 in the wavelength-tunable laser device 100 are preferably formed with angles along the above-mentioned crystal orientation.

The diffraction grating of the SG-DBRs 1 and 4 has a pattern formed by electron beam drawing or the like. With the electron beam drawing, an electron beam is scanned along grids on specific orthogonal coordinates, so that a high-definition pattern is created. The pattern along coordinate axes can be formed stably but it is difficult to stably form a pattern inclined with respect to the coordinate axes. Accordingly, it is difficult to make the SG-DBRs 1 and 4 extend in different directions.

In order to miniaturize the laser chip while satisfying these restrictions, the waveguide is folded back by 180 degrees in the wavelength-tunable laser device 100. With the folding, the SG-DBRs 1 and 4 extend in the same direction and the gain portion 2 and the SOA 5 extend in the same direction.

The effect is provided even when a folding angle somewhat deviates from 180 degrees. For example, it is assumed that a waveguide with the orientation <011> is preferable for embedding the waveguide of the BH structure satisfactorily. In this case, characteristics less change with deviation of equal to or less than 10 degrees from the orientation, and the waveguide can be buried by crystal growth even with deviation of about 35 degrees therefrom when slight lowering of current injection characteristics is allowed. Even when the folding angle deviates from 180 degrees within an allowable range of lowering of characteristics, the waveguide can be regarded to be substantially bent by 180 degrees in terms of the effect of the first embodiment.

In the folding by 180 degrees, the folded portion may be divided into several parts. For example, a linear waveguide may be inserted into between two bent sites by 90 degrees or the waveguide may be folded back by connecting three bent sites by 60 degrees.

In the wavelength-tunable laser device 100, the folded bending waveguide 3 is provided between the SG-DBR 4 serving as the first reflector and the gain portion 2. With this configuration, the gain portion 2 and the SOA 5 are arranged on both sides with the folded portion interposed by bending therebetween. This configuration is suitable for reduction in the chip length because this arrangement effectively uses the length by making the lengths of the components on both sides of the folded portion equal to each other.

In the wavelength-tunable laser device 100, the folded bending waveguide 3 is used as the phase adjuster. That is to say, the heater 122 is formed with the bending waveguide 3 as a high-mesa waveguide. The bending waveguide 3 has no directional restriction unlike the BH waveguide involving current injection and the DBR involving formation of the diffraction grating pattern with the electron beam drawing as described above, and a waveguide of any desired direction can be used therefor. The high-mesa waveguide has not only high thermal impedance but also characteristics appropriate for the bending waveguide, and it is therefore preferable that the folded bending waveguide 3 be formed as the high-mesa waveguide. For this reason, the bending waveguide 3 is preferably used as the phase adjuster, so that the phase adjuster and the bending waveguide need not to be separately provided, thereby contributing to further miniaturization of the laser chip. In the wavelength-tunable laser using the wavelength filters, when a distance between the two mirrors configuring the laser resonator is too large, the following problem occurs. That is, in such a case, a wavelength interval of the cavity mode decreases and phase adjustment needs to be performed more precisely, resulting in increase in the difficulty of control. Reduction in the length by integration of the bending waveguide and the phase adjuster is advantageous also in this respect.

The wavelength-tunable laser device 100 is used to provide laser light of a desired wavelength with tunable optical power. In the start of usage of the wavelength-tunable laser device 100 at a certain wavelength, an operation of gradually increasing optical power is required after adjusting the wavelength to a desired laser emission wavelength in a state of no optical power to the outside of the wavelength-tunable laser device 100. In the wavelength-tunable laser device 100 in which the SOA 5 is integrated, this operation is achieved by turning OFF (opening, short-circuiting, or applying reverse-bias to) the SOA 5, adjusting the wavelength to the laser emission wavelength, and gradually increasing a current value of the SOA 5 in this order. During this operation, a calorific value of the SOA 5 is gradually increased. In contrast, the following problem occurs. That is, since wavelength responses of the wavelength filters (SG-DBR 1 and 4) vary depending on temperatures, the emission wavelength becomes unstable when the SG-DBRs 1 and 4 are influenced by temperature change with heat generation of the SOA 5.

To address the above-mentioned problem, the wavelength-tunable laser device 100 is preferably designed such that distances between the SOA 5 and the SG-DBRs 1 and 4 be equal to or larger than a constant distance. When the components are linearly arranged without bending the optical waveguide, the SOA 5 and the SG-DBRs 1 and 4 are separated in the lengthwise direction. In contrast, when the waveguide is folded back as in the wavelength-tunable laser device 100, the SG-DBR 1 or 4 and the SOA 5 can be arranged at the same position in the lengthwise direction (that is, adjacent positions in the width direction. In such a case, design for the arrangement of them in the width direction is optimized so as to ensure a predetermined distance therebetween. Heat in the laser chip is dissipated to the side of the substrate 101 of the laser chip. It is therefore desired that the SG-DBRs 1 and 4 and the SOA 5 are separated from each other by a sufficiently large distance relative to (for example, by equal to or more than twice of) the thickness of the substrate 101. In the case of the wavelength-tunable laser device 100, the thickness of the substrate 101 is, for example, 120 μm, and the distance between the SOA 5 and the SG-DBR 1 in the width direction is 300 μm.

Second Embodiment

Figure 3:
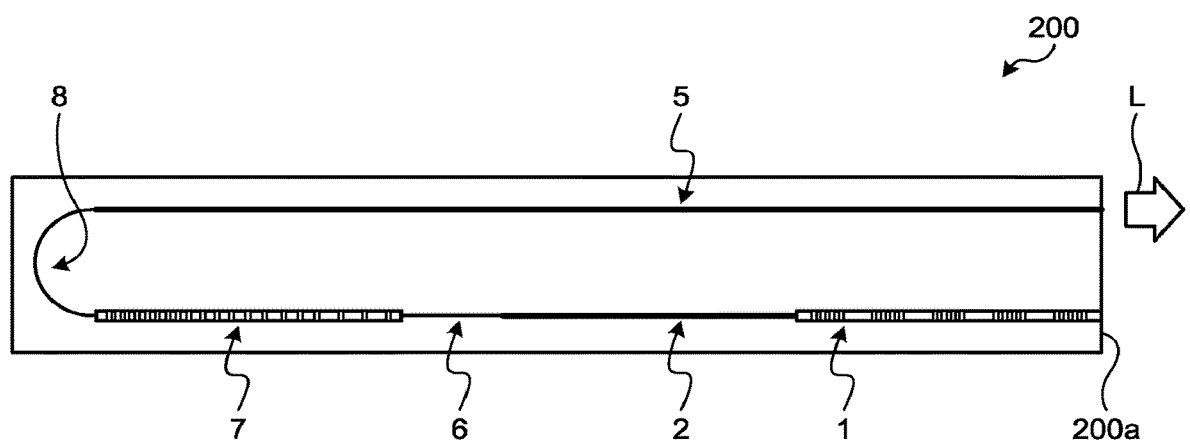
FIG. 3 is a schematic view of a wavelength-tunable laser device according to a second embodiment.

FIG. 3 is a schematic view of a wavelength-tunable laser device according to a second embodiment. A wavelength-tunable laser device 200 is configured by connecting the SG-DBR 1, the gain portion 2, a phase adjuster 6, a DS-DBR 7, a bending waveguide 8, and the SOA 5 in this order.

The SG-DBR 1 includes a second reflector and a wavelength filter that are integrally configured. The known digital supermode distributed Bragg reflector (DS-DER) 7 serving as a wavelength filter includes a first reflector from which laser light is output and a wavelength filter that are integrally configured. The SG-DBR 1 and the DS-DBR 7 configure a laser resonator. Each of the SG-DBR 1 and the DS-DBR 7 has a heater (not illustrated) on the upper surface thereof, and the wavelength characteristics thereof can be adjusted. The reflectivity of the DS-DBR 7 in a certain wavelength bandwidth can be increased by selectively changing the refractive index of a part thereof by heating with the heater. Laser emission occurs at a wavelength of a reflection peak overlapping with the wavelength bandwidth in which the reflectivity of the DS-DBR 7 is increased among periodical reflection peaks of the SG-DBR 1. The wavelength-tunable laser device 200 can therefore perform a wavelength-tunable operation with an operation principle differing from the Vernier effect.

The phase adjuster 6 is provided between the gain portion 2 and the DS-DBR 7 and has a heater (not illustrated) on the upper surface thereof. The bending waveguide 8 is provided between the DS-DBR 7 and the SOA 5 and is bent in a U shape. The DS-DBR 7, the phase adjuster 6, and the bending waveguide 8 preferably have high-mesa structures.

In the wavelength-tunable laser device 200, the bending waveguide 8 connects the DS-DBR 7 and the SOA 5, and the waveguide is folded back with respect to the bending waveguide 8. That is to say, the bending waveguide 8 has a folded portion configured by the waveguide that folds back an optical path by an angle of substantially 180 degrees between the DS-DBR 7 serving as the first reflector from which the laser light is output and the SOA 5.

The SOA 5 amplifies the laser light output from the DS-DBR 7 and outputs it as high-output laser light L from an end facet 200a of the wavelength-tunable laser device 200. It is preferable that AR coating be applied to the end facet 200a.

The wavelength-tunable laser device 200 can reduce the length of the laser chip and can miniaturize it as in the wavelength-tunable laser device 100. Furthermore, the SOA 5 can be increased in length to increase the amplification factor of the SOA 5 and decrease the electric resistance thereof. The wavelength-tunable laser device 200 is therefore appropriate for applications requiring high power. With the above-mentioned design in which the length of the SOA 5 is increased, the entire length is particularly increased in the case of arrangement with no folded portion. Accordingly, an effect by reducing the length with the arrangement with the folded portion is largely provided. As in the wavelength-tunable laser device 100, the extension directions of the SOA 5 and the gain portion 2 can be identical to the crystal orientation because the waveguide is folded back by substantially 180 degrees and the gain portion 2 and the SOA 5 are arranged on both sides with the folded portion interposed therebetween.

Third Embodiment

Figure 4:
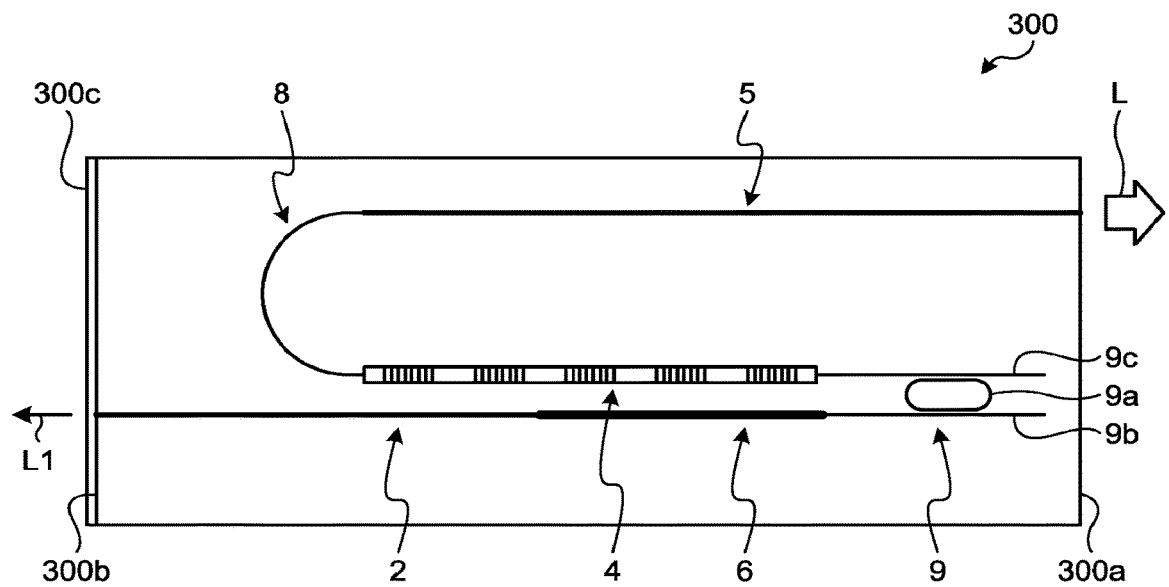
FIG. 4 is a schematic view of a wavelength-tunable laser device according to a third embodiment.

FIG. 4 is a schematic view of a wavelength-tunable laser device according to a third embodiment. A wavelength-tunable laser device 300 is configured by connecting the gain portion 2, the phase adjuster 6, a ring filter 9, the SG-DBR 4, the bending waveguide 8, and the SOA 5 in this order.

The wavelength-tunable laser device 300 has opposing end facets 300a and 300b. AR coating is applied to the end facet 300a and a high-reflection (HR) film 300c is formed on the end facet 300b.

The high-reflecting film 300c is a second reflector. The SG-DBR 4 includes a first reflector from which laser light is output and a wavelength filter that are integrally configured. The high-reflecting film 300c and the SG-DBR 4 configure a laser resonator.

The phase adjuster 6 is provided between the gain portion 2 and the ring filter 9 and has a heater (not illustrated) on the upper surface thereof.

The ring filter 9 includes a ring resonator 9a configured by a waveguide and two arm waveguides 9b and 9c that are optically connected to the ring resonator 9a. The arm waveguide 9b is connected to the phase adjuster 6, and the arm waveguide 9c is connected to the SG-DBR 4.

The ring filter 9 is a transmission-type wavelength filter having periodical transmission peaks with wavelength intervals differing from those of periodical reflection peaks of the SG-DBR 4. The ring resonator 9a has a heater (not illustrated) on the upper surface thereof, and the wavelength characteristics thereof can be adjusted. The ring filter 9 preferably has a high-mesa structure.

In the wavelength-tunable laser device 300, the high-reflecting film 300c and the SG-DBR 4 configure the laser resonator, and the wavelength of laser light L can be adjusted by adjusting the wavelength characteristics of the ring filter 9 and the SG-DBR 4 with the heaters. The wavelength-tunable laser device 300 therefore functions as a Vernier-type wavelength-tunable laser.

It is preferable that the laser light L be output from the SOA 5 on the side of the end facet 300a to which the AR coating is applied. In contrast, laser light L1 is output from the gain portion 2 on the side of the end facet 300b on which the high-reflecting film 300c is formed. The laser light L1 can be used as monitor light for monitoring optical power of the laser light L.

In the wavelength-tunable laser device 300, folding by 180 degrees between the high-reflecting film 300c and the SG-DBR 4 is achieved by utilizing switching of the light traveling direction by 180 degrees between input and output of the ring filter 9. The waveguide to the SOA 5 from the SG-DBR 4 serving as the first reflector on the laser light output side corresponds to the bending waveguide 8 and is further folded back by 180 degrees by the bending waveguide 8. With this configuration, the wavelength-tunable laser device 300 can further reduce the length of the laser chip and can further miniaturize it.

In addition, in the wavelength-tunable laser device 300, the ring filter 9 serving as the transmission-type wavelength filter is arranged in the laser resonator but transmits only light having the wavelengths of the transmission peaks, thereby preventing amplified spontaneous emission (ASE) light having wavelengths regardless of laser emission from being input to the SOA 5 and being output together with the laser light L.

Fourth Embodiment

Figure 5:
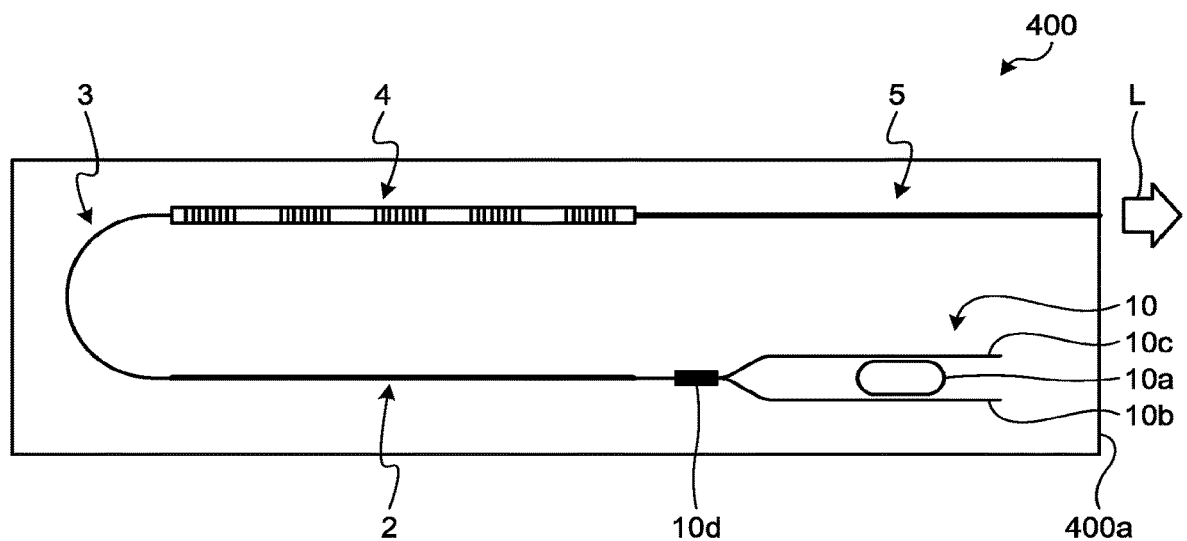
FIG. 5 is a schematic view of a wavelength-tunable laser device according to a fourth embodiment.

FIG. 5 is a schematic view of a wavelength-tunable laser device according to a fourth embodiment. A wavelength-tunable laser device 400 is configured by connecting a loop mirror 10, the gain portion 2, the bending waveguide 3 also functioning as a phase adjuster, the SG-DBR 4, and the SOA 5 in this order.

The loop mirror 10 includes a ring resonator 10a configured by a waveguide, two arm waveguides 10b and 10c that are optically connected to the ring resonator 10a, and a 1×2 optical multiplexer/demultiplexer 10d. The optical multiplexer/demultiplexer 10d is a waveguide configured by, for example, an MMI coupler, and the one-port side thereof is connected to the gain portion 2 and the two-port side thereof is connected to the two arm waveguides 10b and 10c.

The loop mirror 10 is a reflection-type wavelength filter having periodical reflection peaks with wavelength intervals differing from those of periodical reflection peaks of the SG-DBR 4. The ring resonator 10a has a heater (not illustrated) on the upper surface thereof, and the wavelength characteristics thereof can be adjusted. The loop mirror 10 thus includes a reflector and a wavelength filter that are integrally configured. The loop mirror 10 preferably has a high-mesa structure.

In the wavelength-tunable laser device 400, the loop mirror 10 and the SG-DBR 4 configure a laser resonator, and the wavelength of laser light L can be adjusted by adjusting the wavelength characteristics of the loop mirror 10 and the SG-DBR 4 with the heaters. The wavelength-tunable laser device 400 therefore functions as a Vernier-type wavelength-tunable laser. The laser light L is preferably output from the SOA 5 on the side of an end facet 400a to which AR coating is applied.

In the wavelength-tunable laser device 400, the bending waveguide 3 has a folded portion configured by a waveguide that folds back an optical path by an angle of substantially 180 degrees between the loop mirror 10 and the SG-DBR 4, thereby reducing the length of the laser chip and achieving miniaturization thereof. Furthermore, ASE light having wavelengths regardless of laser emission can be prevented from being input to the SOA 5 and being output together with the laser light L.

Fifth Embodiment

Figure 6:
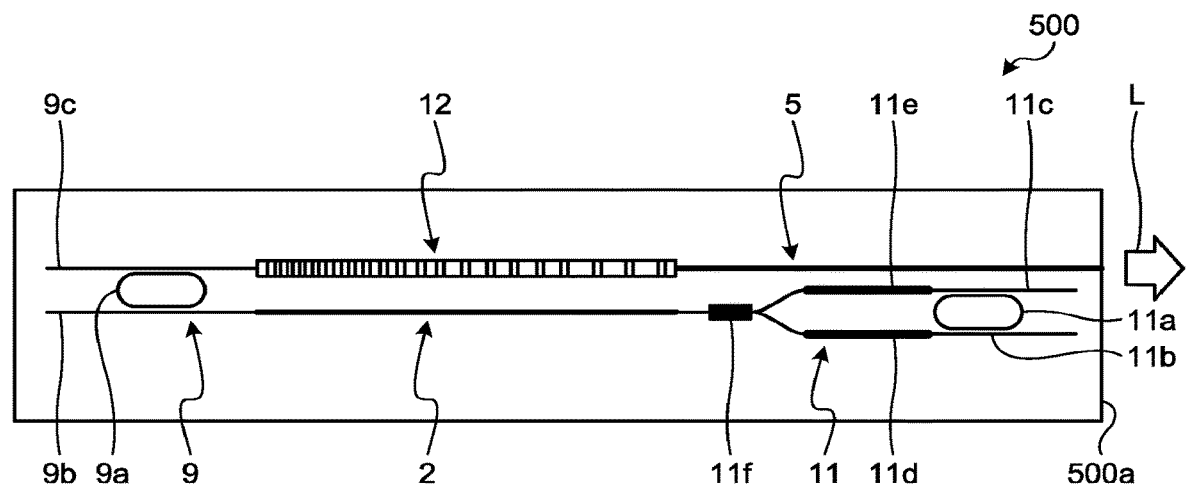
FIG. 6 is a schematic view of a wavelength-tunable laser device according to a fifth embodiment.

FIG. 6 is a schematic view of a wavelength-tunable laser device according to a fifth embodiment. A wavelength-tunable laser device 500 is configured by connecting a loop mirror 11, the gain portion 2, the ring filter 9 as a transmission-type wavelength filter, a known chirped grating distributed Bragg reflector (CG-DBR) 12, and the SOA 5 in this order.

The loop mirror 11 includes a ring resonator 11a configured by a waveguide, two arm waveguides 11b and 11c that are optically connected to the ring resonator 11a, two phase adjusters 11d and 11e as waveguides that are respectively connected to the two arm waveguides 11b and 11c, and a 1×2 optical multiplexer/demultiplexer 11f. The optical multiplexer/demultiplexer 11f is a waveguide configured by, for example, an MMI coupler, and the one-port side thereof is connected to the gain portion 2 and the two-port side thereof is connected to the two phase adjusters 11d and 11e.

The loop mirror 11 is a reflection-type wavelength filter having periodical reflection peaks with wavelength intervals differing from those of periodical reflection peaks of the ring filter 9. The ring resonator 11a has a heater (not illustrated) on the upper surface thereof, and the wavelength characteristics thereof can be adjusted. The phase adjusters 11d and 11e have heaters (not illustrated) on the upper surfaces thereof. The loop mirror 11 thus includes a reflector, a wavelength filter, and a phase adjuster that are integrally configured. The loop mirror 11 preferably has a high-mesa structure.

The CG-DBR 12 is a first reflector from which laser light is output and has a relatively wide reflection bandwidth. In the wavelength-tunable laser device 500, the loop mirror 11 and the CG-DBR 12 configure a laser resonator, and the wavelength of the laser light L can be adjusted by adjusting the wavelength characteristics of the loop mirror 11 and the ring filter 9 with the heaters. The wavelength-tunable laser device 500 therefore functions as a Vernier-type wavelength-tunable laser. It is preferable that the laser light L be output from the SOA 5 on the side of an end facet 500a to which AR coating is applied.

In the wavelength-tunable laser device 500, folding by 180 degrees between the loop mirror 11 and the CG-DBR 12 is achieved by utilizing the ring filter 9, thereby reducing the length of the laser chip and achieving miniaturization thereof. Furthermore, ASE light having wavelengths regardless of laser emission can be prevented from being input to the SOA 5 and being output together with the laser light L.

Sixth Embodiment

Figure 7:
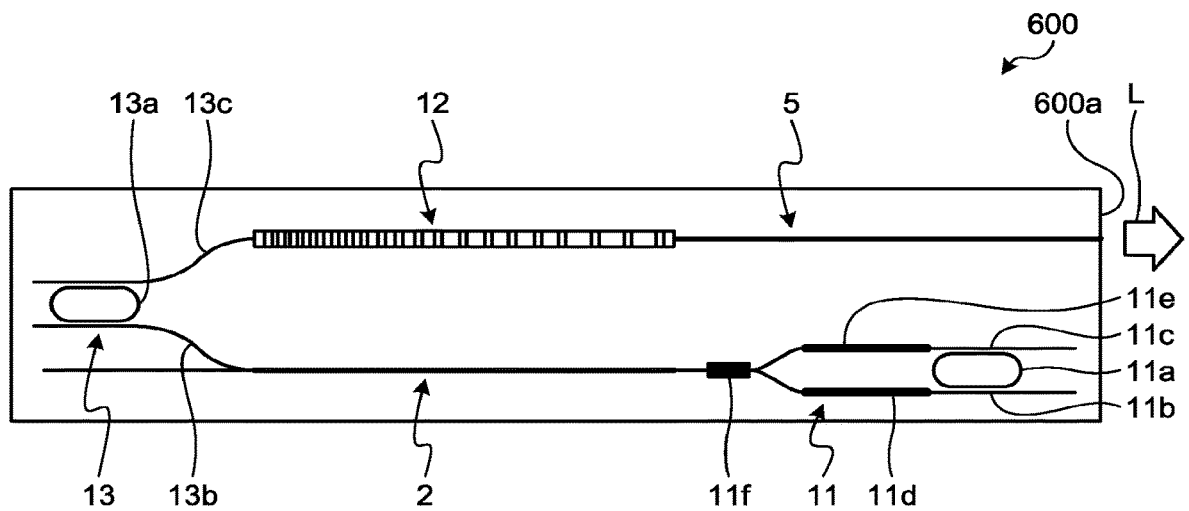
FIG. 7 is a schematic view of a wavelength-tunable laser device according to a sixth embodiment.

FIG. 7 is a schematic view of a wavelength-tunable laser device according to a sixth embodiment. A wavelength-tunable laser device 600 is configured by replacing the ring filter 9 in the wavelength-tunable laser device 500 illustrated in FIG. 6 by a ring filter 13. It is preferable that Laser light L be output from the SOA 5 on the side of an end facet 600a to which AR coating is applied.

The ring filter 13 includes a ring resonator 13a configured by a waveguide and two arm waveguides 13b and 13c that are optically connected to the ring resonator 13a. The ring filter 13 is different from the ring filter 9 in that the arm waveguides 13b and 13c are S-shaped waveguides.

As described in the first embodiment, the wavelength-tunable laser device needs to be designed such that the distance between the SOA 5 and the wavelength filter is equal to or larger than the constant distance in order to prevent interference of operations with heat. Heat in the laser chip is dissipated to the side of the substrate of the laser chip. It is therefore desired that the wavelength filter and the SOA 5 are separated from each other by a sufficiently large distance relative to (for example, by equal to or more than twice of) the thickness of the substrate. The wavelength-tunable laser device 600 is preferable because a distance between the loop mirror 11 and the SOA 5 is increased by forming the arm waveguides 13b and 13c into the S shapes.

Seventh Embodiment

Figure 8:
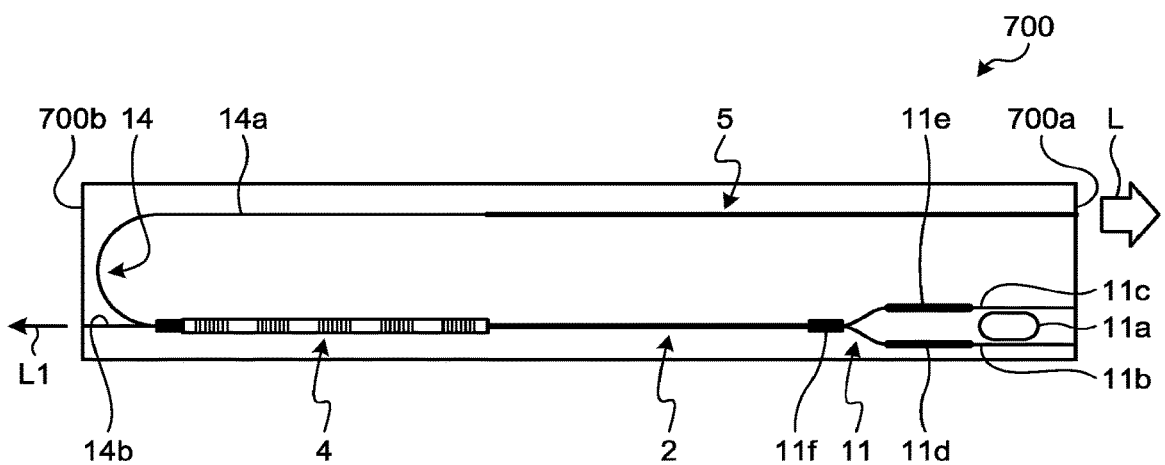
FIG. 8 is a schematic view of a wavelength-tunable laser device according to a seventh embodiment.

FIG. 8 is a schematic view of a wavelength-tunable laser device according to a seventh embodiment. A wavelength-tunable laser device 700 is configured by connecting the loop mirror 11, the gain portion 2, the SG-DBR 4, an optical multiplexer/demultiplexer 14 serving as an optical branching portion, and the SOA 5 in this order.

The wavelength-tunable laser device 700 has opposing end facets 700a and 700b. AR coating is applied to the end facets 700a and 700b.

The optical multiplexer/demultiplexer 14 is a 1×2 optical multiplexer/demultiplexer provided between the SG-DBR 4 and the SOA 5, and the one-port side thereof is connected to the SG-DBR 4. One of two ports of the optical multiplexer/demultiplexer 14 serves as a bending waveguide 14a and is connected to the SOA 5. The other of the two ports thereof serves as a monitor waveguide 14b reaching the end facet 700b.

In the wavelength-tunable laser device 700, the loop mirror 11 and the SG-DBR 4 configure a laser resonator, and the wavelength of laser light L can be adjusted by adjusting the wavelength characteristics of the loop mirror 11 and the SG-DBR 4 with the heaters. The wavelength-tunable laser device 700 therefore functions as a Vernier-type wavelength-tunable laser. It is preferable that the laser light L be output from the SOA 5 on the side of the end facet 700a to which the AR coating is applied.

In the wavelength-tunable laser device 700, the bending waveguide 14a of the optical multiplexer/demultiplexer 14 has a folded portion configured by a waveguide that folds back an optical path by an angle of substantially 180 degrees between the SG-DBR 4 and the SOA 5, thereby reducing the length of the laser chip and achieving miniaturization thereof. Furthermore, the SOA 5 can be increased in length to increase the amplification factor of the SOA 5 and decrease the electric resistance thereof. With the above-mentioned design in which the length of the SOA 5 is increased, the entire length is particularly increased in the case of arrangement with no folded portion. Accordingly, an effect by reducing the length with the arrangement with the folded portion is largely provided. In addition, the optical multiplexer/demultiplexer 14 branches a part of the laser light that is output from the SG-DBR 4 to the SOA 5, and the part of the laser light is guided, as laser light L1, through the monitor waveguide 14b and is output from the end facet 700b. The laser light L1 can thereby be used as monitor light for monitoring optical power of the laser light L.

Eighth Embodiment

Figure 9:
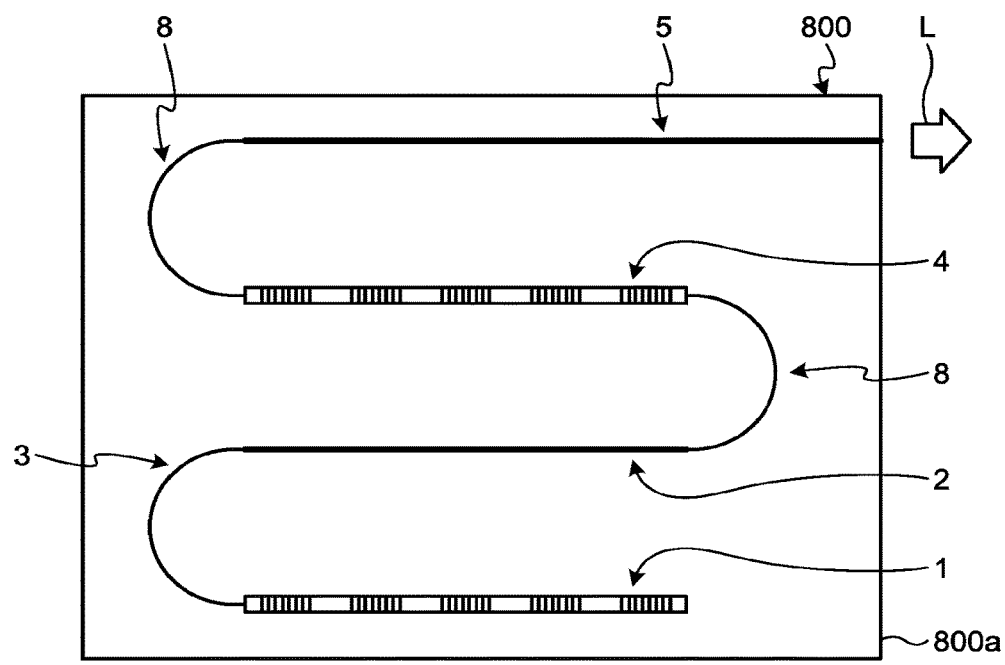
FIG. 9 is a schematic view of a wavelength-tunable laser device according to an eighth embodiment.

FIG. 9 is a schematic view of a wavelength-tunable laser device according to an eighth embodiment. A wavelength-tunable laser device 800 is configured by connecting the SG-DBR 1, the bending waveguide 3 also functioning as a phase adjuster, the gain portion 2, the bending waveguide 8, the SG-DBR 4, the bending waveguide 8, and the SOA 5 in this order.

In the wavelength-tunable laser device 800, the SG-DBR 1 and the SG-DBR 4 configure a laser resonator, and the wavelength of laser light L can be adjusted by adjusting the wavelength characteristics of the SG-DBR 1 and the SG-DBR 4 with the heaters. The wavelength-tunable laser device 800 therefore functions as a Vernier-type wavelength-tunable laser. It is preferable that the laser light L be output from the SOA 5 on the side of an end facet 800a to which AR coating is applied.

In the wavelength-tunable laser device 800, the bending waveguide 3 and the bending waveguide 8 between the gain portion 2 and the SG-DBR 4 have folded portions configured by the waveguides that fold back an optical path twice by an angle of substantially 180 degrees between the SG-DBR 1 and the SG-DBR 4. Furthermore, the bending waveguide 8 between the SG-DBR 4 and the SOA 5 has a folded portion configured by the waveguide that folds back the optical path by an angle of substantially 180 degrees. That is to say, the wavelength-tunable laser device 800 includes three folded portions, thereby extremely reducing the length of the laser chip and achieving further miniaturization thereof.

Ninth Embodiment

Figure 10:
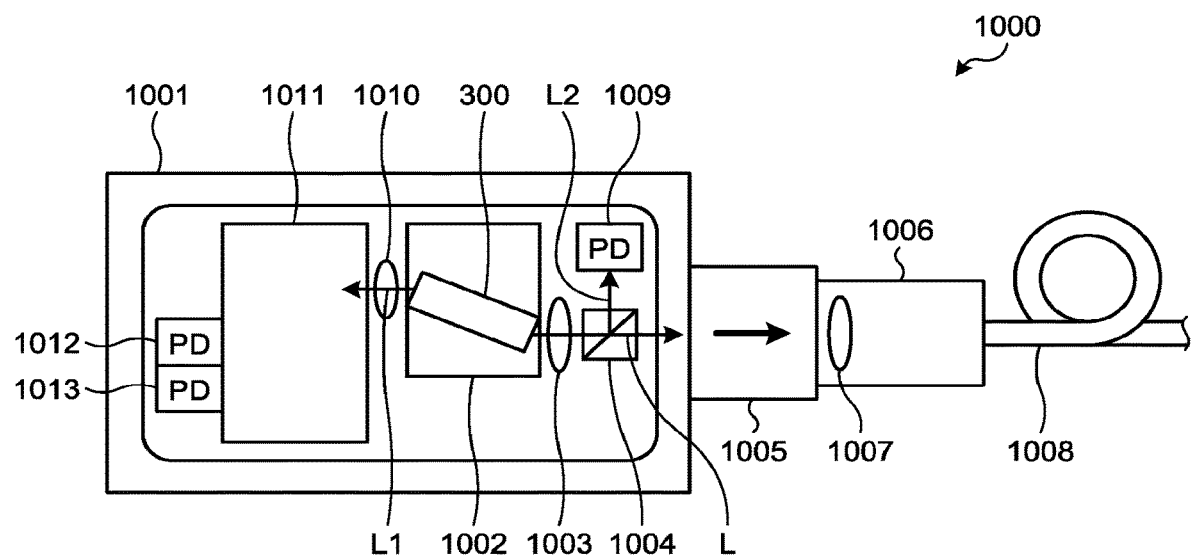
FIG. 10 is a schematic view of an optical module according to a ninth embodiment.

FIG. 10 is a schematic view of an optical module according to a ninth embodiment. An optical module 1000 is a laser module and includes a package 1001, a sub-mount 1002, the wavelength-tunable laser device 300 according to the third embodiment, a collimate lens 1003, a beam splitter 1004, an optical isolator 1005, a lens housing portion 1006, a condenser lens 1007, an optical fiber 1008, a photo diode (PD) 1009 as a light receiving element, a coupling lens 1010, a wavelength detector 1011, a PD 1012, and a PD 1013. A temperature adjuster such as a Peltier element is provided between the sub-mount 1002 and the package 1001. A controller supplies a driving current to the temperature adjuster to adjust the temperature of the wavelength-tunable laser device 300.

The sub-mount 1002, the wavelength-tunable laser device 300, the collimate lens 1003, the beam splitter 1004, the PD 1009, the coupling lens 1010, the wavelength detector 1011, and the PDs 1012 and 1013 are accommodated in the package 1001. Although the package 1001 includes an upper lid, a state in which the upper lid is detached is illustrated for explaining the internal configuration. The optical isolator 1005 is attached to the outside of the package 1001. The lens housing portion 1006 is attached to the optical isolator 1005. The condenser lens 1007 is housed in the lens housing portion 1006. The optical fiber 1008 is attached to the lens housing portion 1006.

The wavelength-tunable laser device 300 is mounted on the sub-mount 1002 in the package 1001. The wavelength-tunable laser device 300 receives supply of the driving current from the controller (not illustrated) and outputs the laser light L and the laser light L1. The collimate lens 1003 collimates the laser light L. The beam splitter 1004 branches, as laser light L2, a part of the collimated laser light L and transmits remaining light components. The optical isolator 1005 transmits the laser light L that has passed through the beam splitter 1004 to the side of the condenser lens 1007 and blocks light input from the side of the condenser lens 1007. The condenser lens 1007 condenses the laser light L that has passed through the optical isolator 1005 and couples it to the optical fiber 1008. The coupled laser light L propagates in the optical fiber 1008.

The PD 1009 receives the laser light L2 branched by the beam splitter 1004 and outputs, to the controller, a current signal in accordance with received optical power. The controller controls the driving current that is supplied to the wavelength-tunable laser device 300 on the basis of the current signal. The optical power can be controlled to be constant by, for example, controlling the driving current to make the current signal be a constant value.

The coupling lens 1010 couples the laser light L1 to the wavelength detector 1011. The wavelength detector 1011 includes at least an optical branching portion and a filter portion. In the wavelength detector 1011, the optical branching portion branches the laser light L1 into two components and inputs one laser light component to the PD 1012. The filter portion has periodical transmission characteristics in terms of an optical frequency. The filter portion transmits the other laser light component of the laser light L1 branched into two, and then, inputs it to the PD 1013. Each of the PDs 1012 and 1013 receives the input laser light and outputs, to the controller, a current signal in accordance with received optical power thereof. The controller controls a driving current that is supplied to the temperature adjuster on the basis of these current signals to adjust the temperature of the wavelength-tunable laser device 300, thereby controlling the wavelength of the laser light L. The above-mentioned control is a known technique called wavelength lock. The wavelength detector 1011 can be implemented by an optical waveguide element such as a planar lightwave circuit (PLC) and a space coupling system. The filter portion can be implemented by, for example, a ring filter or an etalon filter.

The optical module 1000 is configured such that the optical components are housed in the extremely small-sized package 1001 having the width of 5 mm and the length of 8 mm, and for example, the optical isolator 1005 and the like are therefore attached to the outside of the package 1001.

As a result of reduction in the areas of the components in the package 1001 in the configuration of the optical module 1000, a ratio occupied by the area (in particular, the length) of the wavelength-tunable laser device 300 in the area in the package 1001 is large. The wavelength-tunable laser device 300 is however reduced in size, so that the optical module 1000 can be reduced in size overall.

In the optical module 1000, the wavelength-tunable laser device 700 according to the seventh embodiment may be used instead of the wavelength-tunable laser device 300. Any of the wavelength-tunable laser devices 100, 200, 400 to 600, and 800 according to the other embodiments may be modified so as to output laser light for monitoring to the opposite side to the laser light L for use instead of the wavelength-tunable laser device 300.

A modulator integrated-type optical module using any of the wavelength-tunable laser devices according to the first to eighth embodiments as a local emission light source can also be configured instead of the optical module 1000 serving as the laser module.

The present disclosure can provide a wavelength-tunable laser and an optical module appropriate for miniaturization.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A waveguide based wavelength-tunable laser formed on a semiconductor substrate, the wavelength-tunable laser comprising:
   a first reflector from which laser light is output;
   a second reflector configuring a laser resonator together with the first reflector;
   a gain portion that is provided between the first reflector and the second reflector;
   at least two wavelength filters that can adjust wavelength characteristics and adjust a wavelength of the laser light;
   a phase adjuster that adjusts an optical path length in the laser resonator, wherein
   a folded portion configured by a waveguide that folds back an optical path by an angle of substantially 180 degrees is provided between the first reflector and the second reflector; and
   a semiconductor optical amplifier that is provided on a laser light output side of the first reflector on the semiconductor substrate, wherein at least one of the two wavelength filters and the phase adjuster has a refractive index that is adjusted by a heater and is arranged to be separated from the semiconductor optical amplifier by a distance larger than a thickness of the semiconductor substrate.

2. The wavelength-tunable laser according to claim 1, wherein the folded portion is configured by a bending waveguide.

3. The wavelength-tunable laser according to claim 1, wherein the folded portion is configured by a ring filter including a ring resonator and two arm waveguides that are optically connected to the ring resonator.

4. The wavelength-tunable laser according to claim 1, wherein a plurality of the folded portions are provided.

5. The wavelength-tunable laser according to claim 1, wherein the first reflector or the second reflector and any one of the wavelength filters are integrally configured.

6. The wavelength-tunable laser according to claim 1, wherein the first reflector or the second reflector and the phase adjuster are integrally configured.

7. The wavelength-tunable laser according to claim 1, wherein the folded portion between the first reflector and the second reflector, and the phase adjuster are integrally configured.

8. The wavelength-tunable laser according to claim 1, wherein the gain portion and the semiconductor optical amplifier are arranged on both sides of the folded portion.

9. An optical module comprising the wavelength-tunable laser according to claim 1.

10. A waveguide based wavelength-tunable laser formed on a semiconductor substrate, the wavelength-tunable laser comprising:
- a first reflector from which laser light is output;
- a second reflector configuring a laser resonator together with the first reflector;
- a gain portion that is provided between the first reflector and the second reflector;
- at least two wavelength filters that can adjust wavelength characteristics and adjust a wavelength of the laser light;
- a phase adjuster that adjusts an optical path length in the laser resonator, wherein
- a folded portion configured by a waveguide that folds back an optical path by an angle of substantially 180 degrees is provided between the first reflector and the second reflector;
- a semiconductor optical amplifier that is provided on a laser light output side of the first reflector on the semiconductor substrate; and
- an optical branching portion that is provided between the first reflector and the semiconductor optical amplifier and branches a part of the laser light that is output from the first reflector to the semiconductor optical amplifier, a waveguide guiding the part of the laser light branched reaching an end facet other than an end facet from which the laser light is output.

11. A waveguide based wavelength-tunable laser formed on a semiconductor substrate, comprising:
- a first reflector from which laser light is output;
- a second reflector configuring a laser resonator together with the first reflector;
- a gain portion that is provided between the first reflector and the second reflector;
- at least two wavelength filters that can adjust wavelength characteristics and adjust a wavelength of the laser light;
- a phase adjuster that adjusts an optical path length in the laser resonator; and
- a semiconductor optical amplifier that is provided on a laser light output side of the first reflector, wherein:
  - a folded portion configured by a waveguide that folds back an optical path by an angle of substantially 180 degrees is provided between the first reflector and the semiconductor optical amplifier, and
  - at least one of the two wavelength filters and the phase adjuster has a refractive index that is adjusted by a heater and is arranged to be separated from the semiconductor optical amplifier by a distance larger than a thickness of the semiconductor substrate.

12. The wavelength-tunable laser according to claim 11, wherein the folded portion is configured by a bending waveguide.

13. The wavelength-tunable laser according to claim 11, wherein a folded portion configured by a waveguide that folds back an optical path by an angle of substantially 180 degrees is provided between the first reflector and the second reflector.

14. The wavelength-tunable laser according to claim 13, wherein a plurality of the folded portions are provided.

15. The wavelength-tunable laser according to claim 13, wherein the folded portion between the first reflector and the second reflector, and the phase adjuster are integrally configured.

16. An optical module comprising the wavelength-tunable laser according to claim 13.

17. A waveguide based wavelength-tunable laser formed on a semiconductor substrate, comprising:
- a first reflector from which laser light is output;
- a second reflector configuring a laser resonator together with the first reflector;
- a gain portion that is provided between the first reflector and the second reflector;
- at least two wavelength filters that can adjust wavelength characteristics and adjust a wavelength of the laser light;
- a phase adjuster that adjusts an optical path length in the laser resonator;
- a semiconductor optical amplifier that is provided on a laser light output side of the first reflector, wherein a folded portion configured by a waveguide that folds back an optical path by an angle of substantially 180 degrees is provided between the first reflector and the semiconductor optical amplifier, and
- an optical branching portion that is provided between the first reflector and the semiconductor optical amplifier and branches a part of the laser light that is output from the first reflector to the semiconductor optical amplifier, a waveguide guiding the part of the laser light branched reaching an end facet other than an end facet from which the laser light is output.

* * * * *